United States Patent
Goulden et al.

(10) Patent No.: US 9,204,576 B2
(45) Date of Patent: Dec. 1, 2015

(54) APPARATUS, SYSTEM, AND METHOD FOR CONFIGURING A SYSTEM OF ELECTRONIC CHASSIS

(75) Inventors: Jason E. Goulden, Los Gatos, CA (US); Charles C. Byers, Wheaton, IL (US)

(73) Assignee: CISCO TECHNOLGY, INC., San Jose, CA (US)

( * ) Notice: Subject to any disclaimer, the term of this patent is extended or adjusted under 35 U.S.C. 154(b) by 361 days.

(21) Appl. No.: 13/619,191

(22) Filed: Sep. 14, 2012

(65) Prior Publication Data

US 2014/0078668 A1 Mar. 20, 2014

(51) Int. Cl.
H05K 7/20 (2006.01)
G06F 1/20 (2006.01)

(52) U.S. Cl.
CPC .............. H05K 7/20736 (2013.01); G06F 1/20 (2013.01); H05K 7/20145 (2013.01); H05K 7/20745 (2013.01); H05K 7/20781 (2013.01)

(58) Field of Classification Search
USPC ........................ 361/679.48–679.51, 690, 692, 361/694–695, 716, 721; 312/223.2, 236
See application file for complete search history.

(56) References Cited

U.S. PATENT DOCUMENTS

| | | | |
|---|---|---|---|
| 6,499,609 B2 * | 12/2002 | Patriche et al. | 211/175 |
| 6,813,152 B2 * | 11/2004 | Perazzo | 361/695 |
| 7,152,418 B2 * | 12/2006 | Alappat et al. | 62/186 |
| 7,154,748 B2 * | 12/2006 | Yamada | 361/690 |
| 7,256,992 B1 * | 8/2007 | Stewart et al. | 361/679.48 |
| 7,259,961 B2 * | 8/2007 | Lucero et al. | 361/695 |
| 7,312,990 B2 * | 12/2007 | Mangold | 361/695 |
| 7,316,606 B2 * | 1/2008 | Shipley et al. | 454/184 |
| 7,420,804 B2 * | 9/2008 | Leija et al. | 361/679.48 |
| 7,430,117 B2 * | 9/2008 | Shabany | 361/695 |
| 7,573,708 B2 * | 8/2009 | Stewart et al. | 361/679.54 |
| 7,660,108 B2 * | 2/2010 | Baker et al. | 361/679.39 |
| 7,701,714 B2 * | 4/2010 | Shabany | 361/698 |
| 7,755,889 B2 * | 7/2010 | Vinson et al. | 361/679.49 |
| 7,813,121 B2 * | 10/2010 | Bisson et al. | 361/679.51 |
| 7,965,504 B2 * | 6/2011 | Hamlin | 361/695 |
| 8,064,200 B1 * | 11/2011 | West et al. | 361/695 |
| 8,184,450 B1 * | 5/2012 | Goergen | 361/788 |
| 8,446,725 B2 * | 5/2013 | Lam et al. | 361/695 |
| 8,842,431 B2 * | 9/2014 | Byers | 361/679.49 |
| 8,861,200 B2 * | 10/2014 | Malmberg | 361/695 |

(Continued)

FOREIGN PATENT DOCUMENTS

DE 102005009076 A1 * 9/2006 ............... H05K 7/20
DE 102005009078 A1 * 9/2006 ............... H05K 7/20

OTHER PUBLICATIONS

Cisco Systems, Inc., "Cisco Media Experience Engine (MXE) 5600," © 2011, 4 pages; http://www.cisco.com/en/US/prod/collateral/video/ps9901/ps10588/ps10630/data_sheet_c78-565201.pdf.

(Continued)

Primary Examiner — Robert J Hoffberg
(74) Attorney, Agent, or Firm — Patent Capital Group

(57) ABSTRACT

An example apparatus is provided and may comprise a housing, an electronic blade system, and a plurality of airflow management components. The housing may have an upper chamber and a lower chamber. The electronic blade system may be located between the upper chamber and the lower chamber. The plurality of airflow management components may be configured to be removable and to manage airflow in the housing.

19 Claims, 15 Drawing Sheets

(56) References Cited

U.S. PATENT DOCUMENTS

| | | | | |
|---|---|---|---|---|
| 2005/0162830 A1* | 7/2005 | Wortman et al. | ............. | 361/695 |
| 2006/0256522 A1* | 11/2006 | Wei et al. | ..................... | 361/695 |
| 2007/0178822 A1* | 8/2007 | Lanus et al. | .................. | 454/184 |
| 2009/0097203 A1* | 4/2009 | Byers et al. | .................... | 361/695 |
| 2012/0090821 A1* | 4/2012 | Tian et al. | ..................... | 165/165 |

OTHER PUBLICATIONS

PCI Industrial Computers Manufacturers Group (PICMG), "Advanced TCA™: PICMG 3.0 Short Form Specification," Jan. 2003, 4 pages; http://www.picmg.org/pdf/PICMG_3_0_Shortform.pdf.

Cisco Systems, Inc., "Cisco 3631-CO Modular Access Platform for Operations Support Networks," © 1992-2002, 13 pages; http://www.cisco.com/warp/public/cc/so/cuso/sp/telco/dcn/36asu_ds.pdf.

Neil Rasmussen, "Improving Rack Cooling Performance Using Airflow Management™ Blanking Panels," White Paper 44, Revision 4, © 2011, 11 pages; http://www.apcmedia.com/salestools/SADE-5TPLKQ_R4_EN.pdf.

Telecom Air Filters—Universal Air Filter, "Telecom Air Filters: NEBS compliant custom solutions for demanding telecommunications applications," [retrieved and printed on Sep. 14, 2012], 1 page; http://www.uaf.com/industries-applications/telecom-air-filters/.

Computer Networking Custom Air Filters, "Computer Air Filters: Custom solutions for next-gen computer and data center pplications," [retrieved and printed on Sep. 14, 2012], 1 page; http://www.uaf.com/industries-applications/computer-air-filters/.

Synergy Global Technology Inc., RackmountMart.com, "Rack Cooling Fans / Cabinet Cooling Fans / Wall Mount Cooling Fans," © 2002-2012, 5 pages; http://www.rackmountmart.com/html/fS.htm.

\* cited by examiner

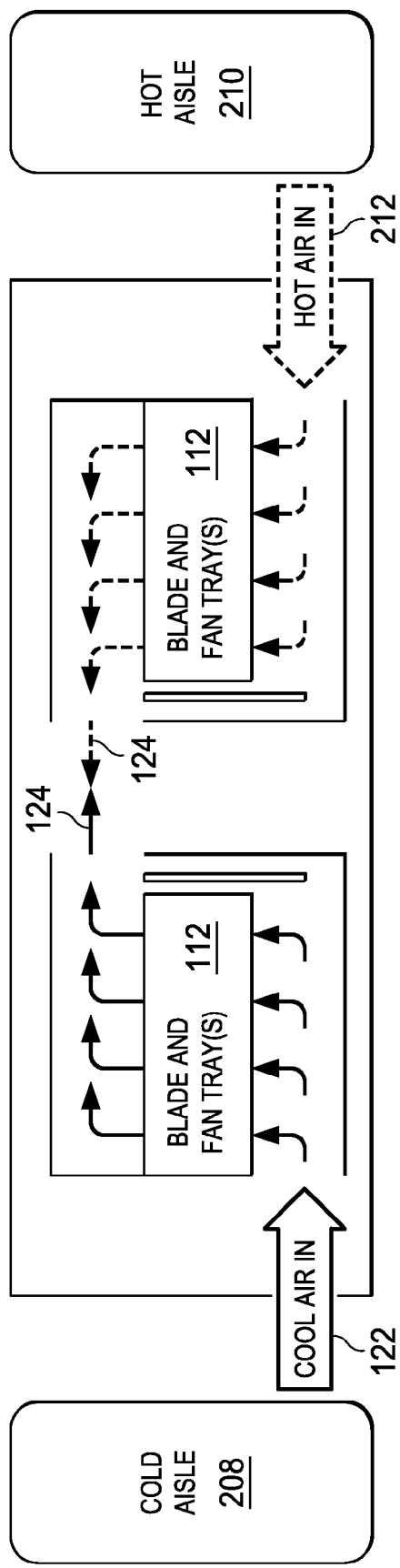

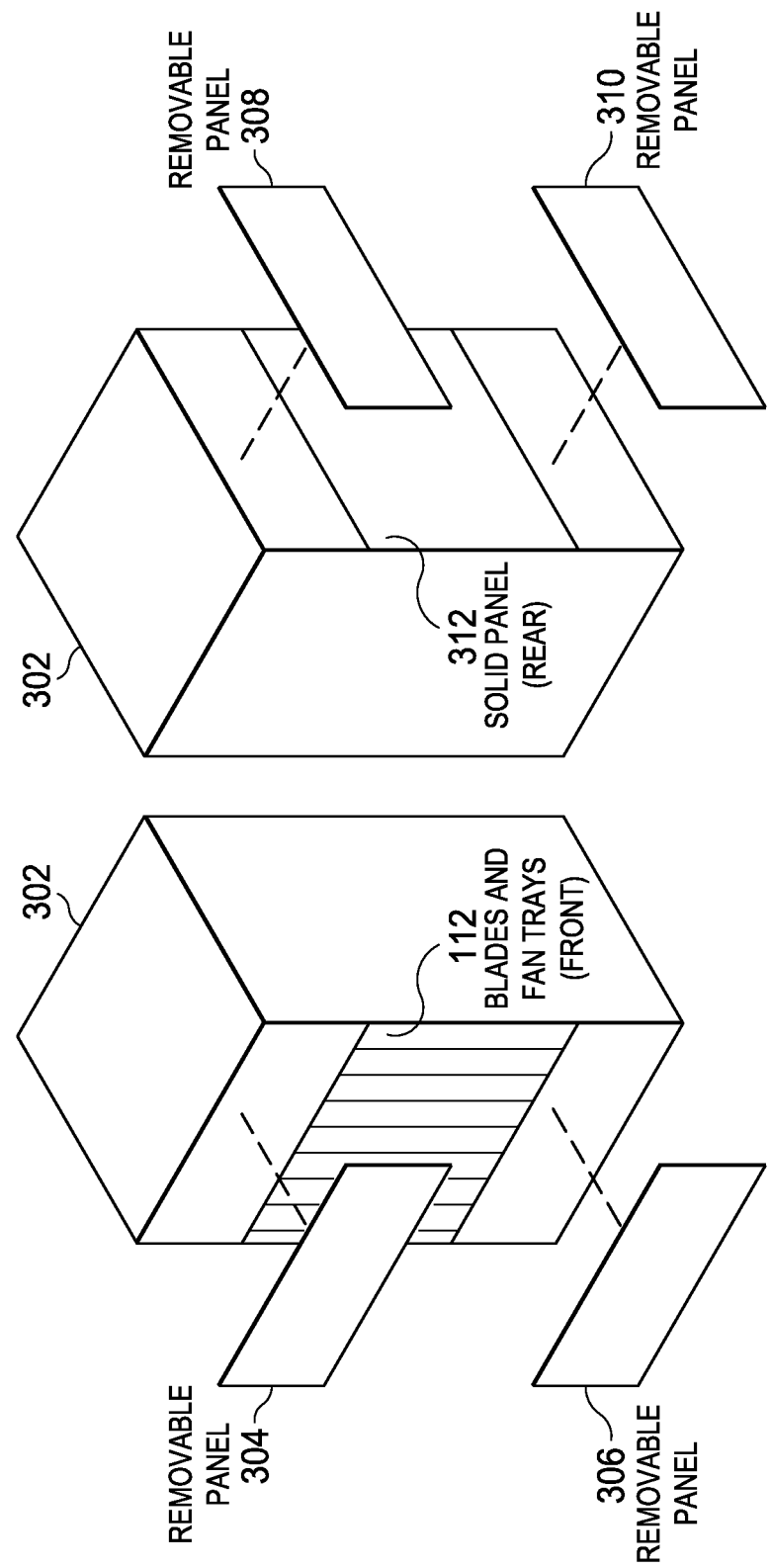

APPARATUS, SYSTEM, AND METHOD FOR CONFIGURING A SYSTEM OF ELECTRONIC CHASSIS

TECHNICAL FIELD

This disclosure relates in general to the field of electronic chassis and, more particularly, to configuring a system for managing cooling of electronic chassis.

BACKGROUND

A blade server is a stripped-down server computer with a modular design optimized to minimize the use of physical space and energy. Blade servers have many components removed to save space, minimize power consumption, and account for other considerations. A blade enclosure, which can hold multiple blade servers, provides services such as power, cooling, networking, various interconnects and management. Together, blades and the blade enclosure form a blade system.

In some situations, these blade systems could be installed in both the front end and rear end of an equipment rack. In these situations, cooling air typically enters the front of the rack, possibly from a cold aisle, and exits through the rear of the rack, possibly into a hot aisle. The blade system may manage the various airflow paths through the rack to insure the cooling air is drawn from (and exhausted to) the appropriate volumes. One example of a blade system is the Advanced Telecommunications Computing Architecture (AdvancedTCA or ATCA) standard for modular electronic packaging from the PCI Industrial Computer Manufacturer's Group (PCIMG).

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 2 is an example illustration of a side view of a cabinet with a first chassis and a second chassis;

FIG. 3 is an example illustration of a chassis with removable airflow management components in accordance with an embodiment;

DETAILED DESCRIPTION OF EXAMPLE EMBODIMENTS

Overview

An apparatus may comprise a housing, an electronic blade system, and a plurality of airflow management components. The housing may be constructed of any suitable material (and formed in any appropriate shape or dimensions) and include an upper chamber and a lower chamber. The electronic blade system may be located between the upper chamber and the lower chamber. The plurality of airflow management components may be configured to be removable and to manage airflow in the housing. The term 'manage' in this context includes any activity associated with influencing, altering, controlling, diverting, directing, or otherwise affecting airflow in any suitable direction.

In more particular embodiments, the upper chamber and the lower chamber extend from a front end of the housing to a rear end of the housing. In different embodiments, the plurality of airflow management components can be selected from a group consisting of a solid cover, a perforated cover, a filter cover, a booster fan module, an air to liquid heat exchanger module, a duct muffler, a round duct connection, and a cable management cover. In other embodiments, a panel of the plurality of airflow management components is located at each end of the upper chamber and each end of the lower chamber. In another embodiment, a plurality of airflow management components of the plurality of airflow management components is located at each end of the upper chamber and each end of the lower chamber. In various embodiments, a number of connectors in at least one of the upper chamber and lower chamber that can provide at least one of power, management signals, and liquid coolant to the plurality of airflow management components.

Example Embodiments

Figure 1:
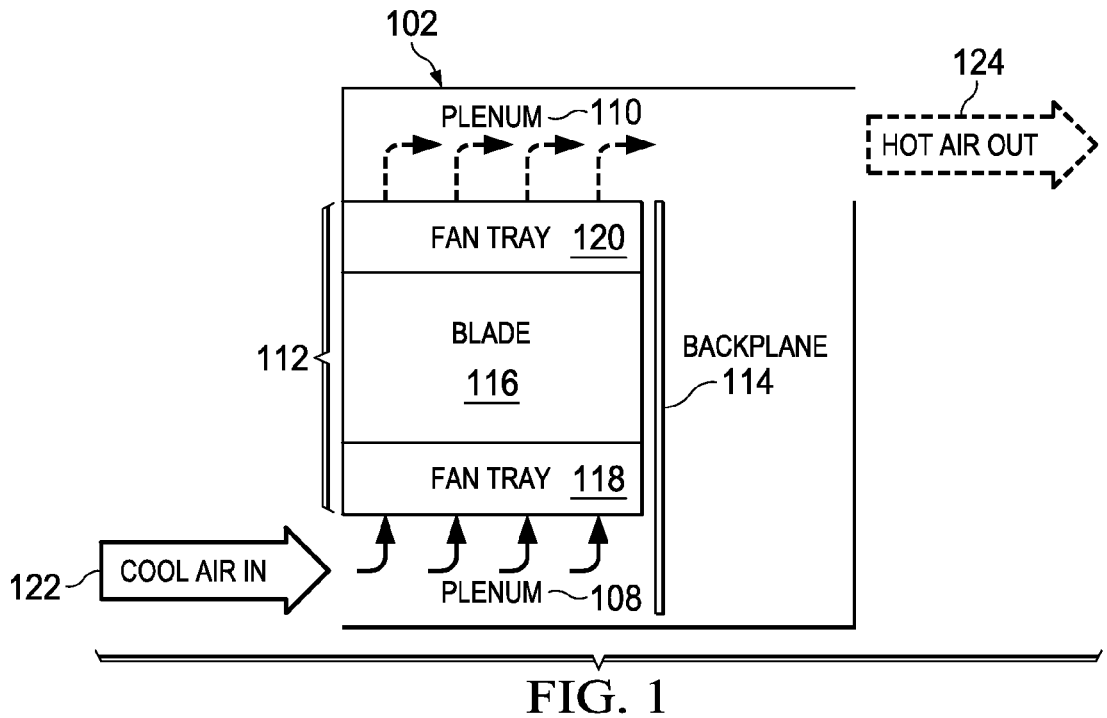
FIG. 1 is an example illustration of a side view of an electronic chassis.

FIG. 1 is a simplified illustration of a side view of an electronic chassis 102. Electronic chassis 102 may include an intake plenum 108, an exhaust plenum 110, a blade system 112, and a backplane 114. Electronic chassis 102 may also be referred to as a housing, which may suitably store, protect, shield, or otherwise enclose, surround, encompass, or cover (either partially or fully) one or more electronic components. The housing may be the actual frame or structure that includes the other components. In AdvancedTCA, the housing may be referred to as the subrack.

Blade system 112 may include multiple blade servers 116, fan trays 118 and 120, and/or any other suitable electronic components, modules, elements, etc., some of which can provide services such as power, cooling, networking, various interconnect functions, management capabilities, etc. Blade system 112 may also include fabrics, I/O blades, and storage blades. Other elements in the blade system can provide interconnect fabric, power, and management. Blade system 112 receives air from intake plenum 108 and vents air into exhaust plenum 110. Plenums 108 and 110 may be spaces used for airflow. Intake plenum 108 may be configured to receive or pull cold air 122 into electronic chassis 102. Conversely, exhaust plenum 110 may push hot air 124 out of electronic chassis 102. Intake plenum 108 may also be referred to herein as a lower chamber. Also, exhaust plenum 110 may be referred to herein as the upper chamber.

Backplane 114 may be the back part of chassis 102. Backplane 114 may be the actual back section of the housing of electronic chassis 102 and not necessarily a separate item, as shown in the representation of FIG. 1.

FIG. 2 is an example illustration of a side view of a cabinet with a first chassis and a second chassis. The cabinet is located between a cold aisle 208 with cold air 122 and a hot aisle 210 with hot air 212. A server room may include more than one cabinet lined in rows and each aisle in the server room may alternate between hot and cold. Cold aisle 208 may be where the air conditioning unit is provides cold air.

In this embodiment of FIG. 2, the first chassis and the second chassis are configured in such a way that the front portion of each faces an aisle so that it is accessible. In this configuration, the exhaust plenums of each chassis face each other and the hot air stays within the cabinet. This can result in the system overheating.

FIG. 3 is an example illustration of a chassis 302 with removable airflow management components 304-310 in accordance with an embodiment. Chassis 302 may include blade system 112 (e.g., blades and fan trays), a backplane 312 (e.g., a solid panel), and removable airflow management components 304-310 (e.g., removable panels). As used herein in this Specification, the term 'airflow management components' may include any suitable panel, surface, object, element, or article that may be associated with airflow. This necessarily includes any component that could operate to define a cavity, a thruway, a passage, a ventilation space, etc. Additionally, this may include both non-electronic components, as well as electronic components.

The front and back ends of chassis 302 are shown to illustrate both blade system 112, backplane 312, and removable airflow management components 304-310 of chassis 302. Removable airflow management components 304-310 may be configured so that they are removable, secured by any suitable mechanism, and/or attached in any number of configurations.

For purposes of illustrating certain example techniques of chassis 302, it is important to understand the issues for a chassis without removable airflow management components (e.g., as shown in FIGS. 1-2). The following foundational information may be viewed as a basis from which the present disclosure may be properly explained. Electronic chassis systems may be rated on their volumetric density. Systems that pack more servers, Ethernet ports, disk drives, etc. per rack unit or blade, per square foot of floor space, or in a given sized cabinet are preferable over lower density alternatives because they achieve lower total cost of ownership. Higher volumetric densities (in functions performed per cubic meter) imply higher volumetric power dissipations (in Watts per cubic meter).

When installing a traditional large form factor chassis with front to back cooling in a cabinet, the front of the chassis (where the air intakes are located) may face a cold aisle. In a hot aisle/cold aisle environment, two chassis may not be able to be installed back-to-back. One significant problem can occur when high intake temperatures from the hot aisle violate the environmental specification for the configured system (chassis plus installed field-replaceable units (FRUs)). A secondary problem that may exist is that the exhaust from both chassis would be directly opposing each other creating a higher pressure at the exhaust for both chassis and reduced cooling performance for both chassis. An example of this problem is illustrated in FIG. 2.

In operational terms, AdvancedTCA systems with vertical board orientation can use a "Z" shaped cooling airflow pattern. Cool air is drawn through an intake duct in the front of the chassis below the blade positions. The air makes an upward 90-degree turn, and flows up through the channels between the boards, cooling them. Then, it makes another 90 degree turn, and exhausts horizontally out of the top rear of the chassis. In different embodiments, fans are located in the intake duct, the exhaust duct, or both.

It may be possible to install chassis back-to-back in a cold room deployment with center exhaust ducted cabinets. However, this configuration would prevent the installation of other equipment like a "pizza box" server that might be 28" deep between the chassis that are back-to-back and the exhaust duct.

A means to package back-to-back systems in a way that provides adequate airflow and maintains hot aisle/cold aisle discipline may be desired. It may be desirable that the same basic chassis design can be used for both single sided and back-to-back installations, as this reduces expenses in development, manufacturing, installation, maintenance, and inventory. This disclosure describes a convertible airflow chassis that can meet these needs.

The volume of the chassis occupied by the blades, manager, fan module(s), and air filter will be referred to as the FRU cage. Note that power supply module(s) may not be included in the FRU cage. In an embodiment, all of the items in the FRU cage may be replaceable from the front of the chassis. The blades may be oriented vertically with one or two fan trays oriented horizontally. The fan tray (s) could be installed in a push (below the blades), a pull (above the blades), or a push/pull (above and below the blades) cooling configuration. The air filter may be installed below all of the fans and blades.

The backplane circuit board may be installed orthogonal to the blades, manager, fan tray, and air filter in the rear volume of the chassis from the bottom surface of the air filter to the upper most edge of the blades (in a push cooling configuration) or the upper most surface of the upper fan tray (pull or push/pull cooling configuration).

The blades, manager, fan tray(s), and optional air filter may interface the backplane circuit board with connectors and sensor(s). Below the FRU cage would be a cold air intake plenum, running the depth of the FRU cage. Above the FRU cage would be a hot air exhaust plenum, also running the depth of the FRU cage. The power supply module(s) may be below the cold air intake plenum. The power supply module(s) may be connected to the backplane by way of a bus bar or suitable cabling. The blades and manager may be cooled from bottom to top by method of the fan(s) moving air from the cold air intake plenum to the hot air exhaust plenum, across the heat dissipating components.

At the front and rear of both the cold air intake plenum and hot air exhaust plenum would be an area which air can pass through with minimal obstruction (e.g. perforated sheet metal or a honeycomb filter, which acts as an electromagnetic control (EMC) block and finger guard). It may be possible to install a solid panel over the top of the perforated area at the front and rear of both plenums to prevent airflow. Installing the solid airflow management components in different configurations (detailed below) would allow two chassis to be installed back-to-back in a cold aisle hot aisle environment in an 800 mm deep or deeper cabinet with pizza box deep form factor (e.g. a 28" deep server) directly above and below the chassis if this is desired. Advantageously, a single design and part type for the FRU cage is used for both the front and rear instance, with airflow configuration components installed differently to correctly direct the cooling airflow.

The power supply modules (either AC/DC rectifier or DC power entry module) below the cold air intake plenum may be cooled by internal bi-directional fans that could be configured to operate in the front to back direction when the chassis is installed facing the cold aisle and in the back to front direction when the chassis is installed facing the hot aisle.

Additionally, having airflow management components that can be installed at the front and rear of both plenums in a number of configurations may address many installation possibilities and allow increased cabinet volume utilization. These embodiments also permit a single chassis design to be used in a single sided, hot aisle, or cold aisle installation.

With respect to FIGS. 4-14, there are many removable airflow management components shown. Many of these are simply illustrated, as solid panels are no panel at all. However, this is for simplicity of the figures. In different embodiments, different components may be used at any of these locations. Additionally, the figures may not always represent a perfect illustration of the actual component.

Figure 4:
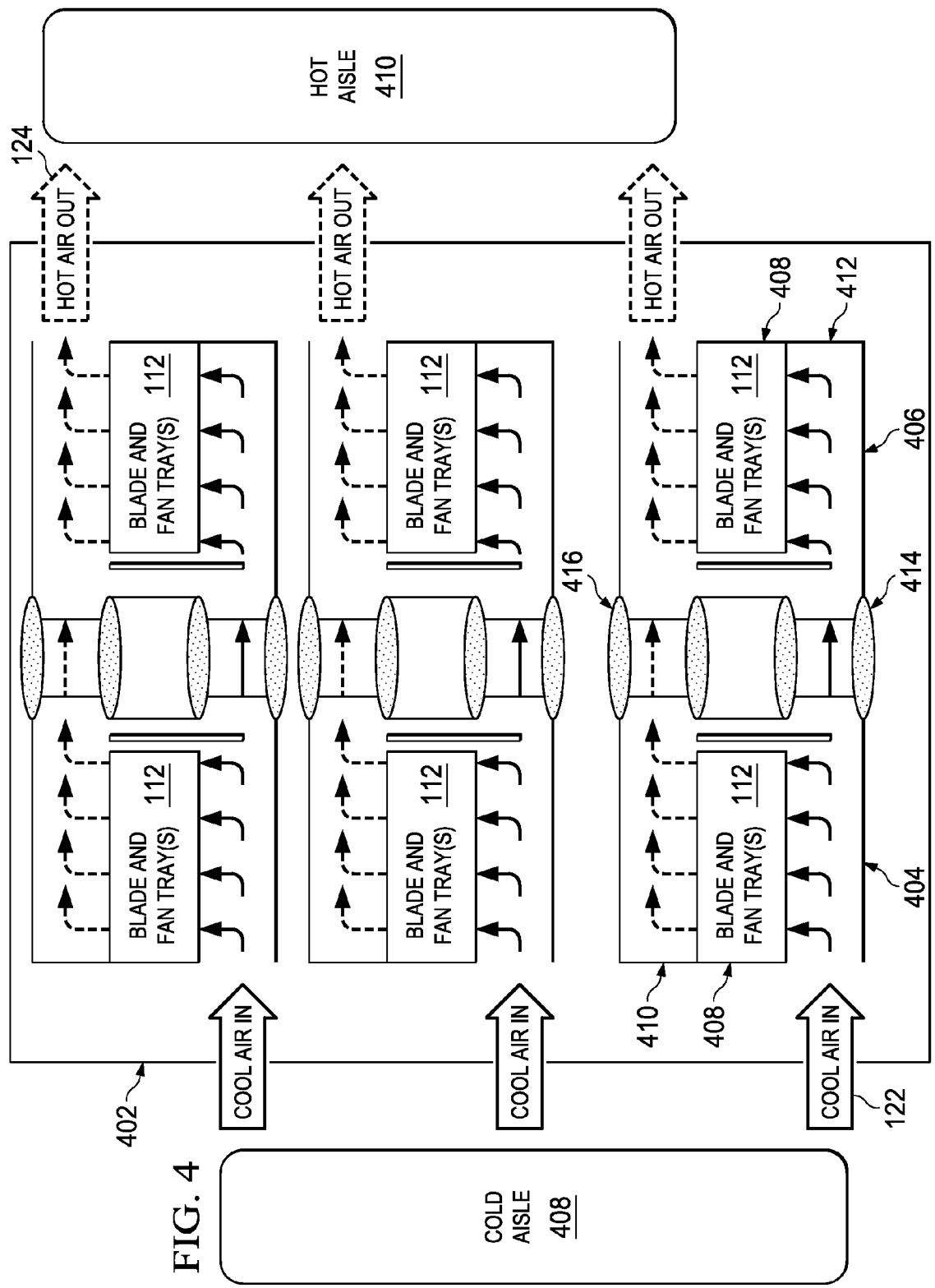
FIG. 4 is an example illustration of a pair of chassis connected by gaskets or ducts in accordance with an embodiment.

FIG. 4 is an example illustration of a pair of chassis connected by gaskets or ducts in accordance with an embodiment. Cabinet 402 includes six chassis in three pairs. Each pair includes a first chassis 404 and a second chassis 406. First chassis 404 faces the cold aisle and second chassis 406 faces the hot aisle. A chassis faces an aisle when the accessible end of the blade system faces that particular aisle (e.g., when the end opposite the backplane faces that particular aisle).

First chassis 404 faces the cold aisle and second chassis 406 faces the hot aisle. In an embodiment, solid airflow management components may be installed at front 410 of hot air exhaust plenum 110 of first chassis 404. Second chassis 406 may have solid airflow management components installed at a front 412 of the cold air intake plenum. The solid airflow management components may not be installed on either of the rear plenum positions on either chassis to facilitate the passage of cooling air from the first chassis 404 to the second chassis 406.

Additionally, the cold air intake plenum of each pair of chassis may be coupled at the rear with a first gasket or a duct 414. The hot air intake plenums of each pair of chassis may also be coupled at the rear with a second gasket or duct 416. In this embodiment, the configuration of the airflow management components and the first gasket or duct allows cool air 122 to travel through to both chassis 404, 406. Cool air 122 travels first into first chassis 404 and then through to second chassis 406. Additionally, the second gasket or duct 414 allows hot air 124 to travel from first chassis 404 through second chassis 406 and into the hot aisle.

Figure 5:
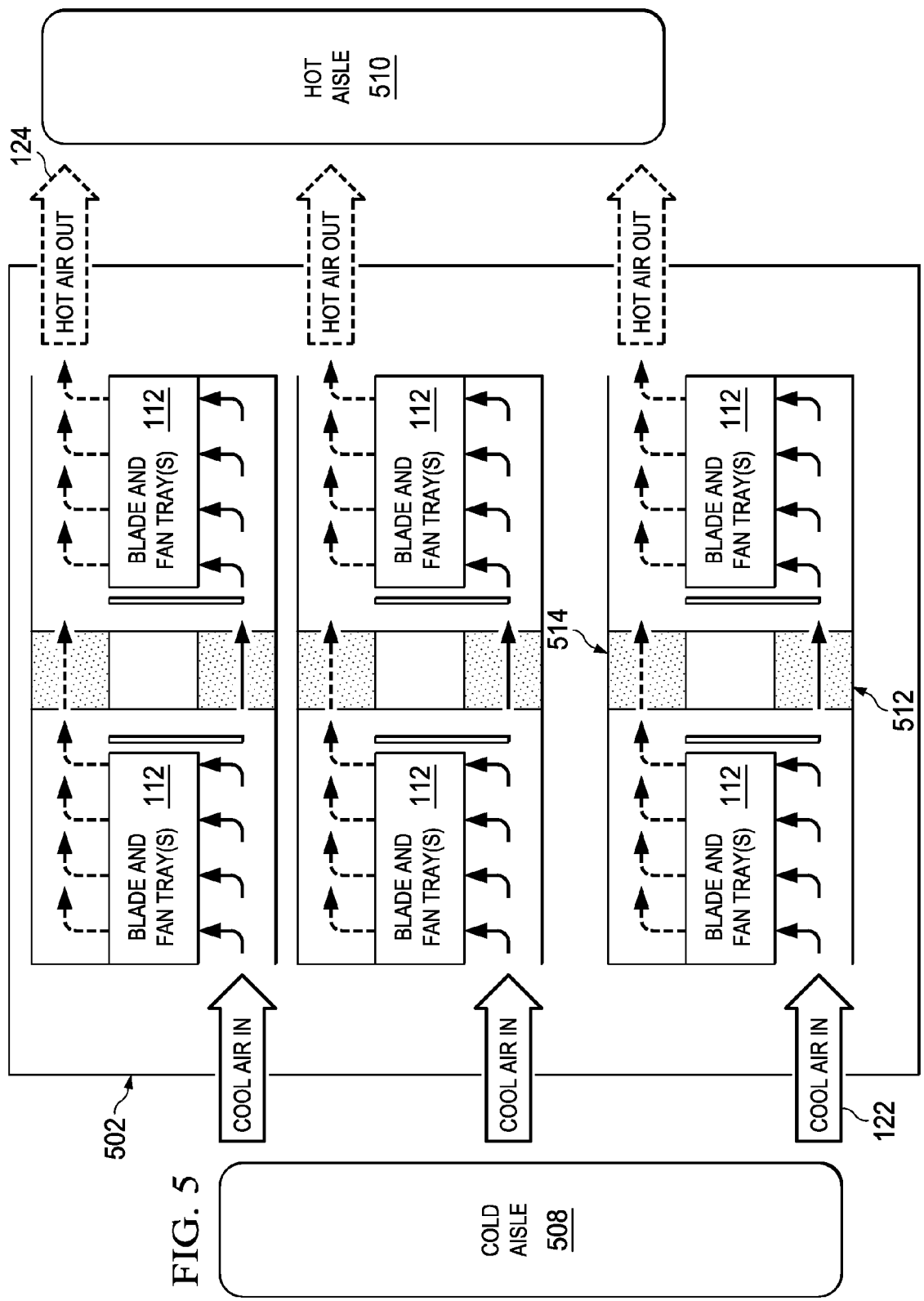
FIG. 5 is an example illustration of a pair of chassis connected by a fan module in accordance with an embodiment.

FIG. 5 is an example illustration of a pair of chassis connected by a fan module in accordance with an embodiment. Cabinet 502 includes six chassis in three pairs. Each pair includes a first chassis and a second chassis. FIG. 5 is similar to FIG. 4 except that instead of gaskets or ducts, there are fan modules 512, 514.

Additionally, the cold air intake plenum of each pair of chassis may be coupled at the rear with fan module 512 that has an effective air seal between plenums and moves air in the direction from the cold aisle towards the hot aisle. The hot air intake plenums of each pair of chassis may also be coupled at the rear with fan module 514 that has an effective air seal between the plenums and moves air in the direction from the cold aisle to the hot aisle.

Figure 6:
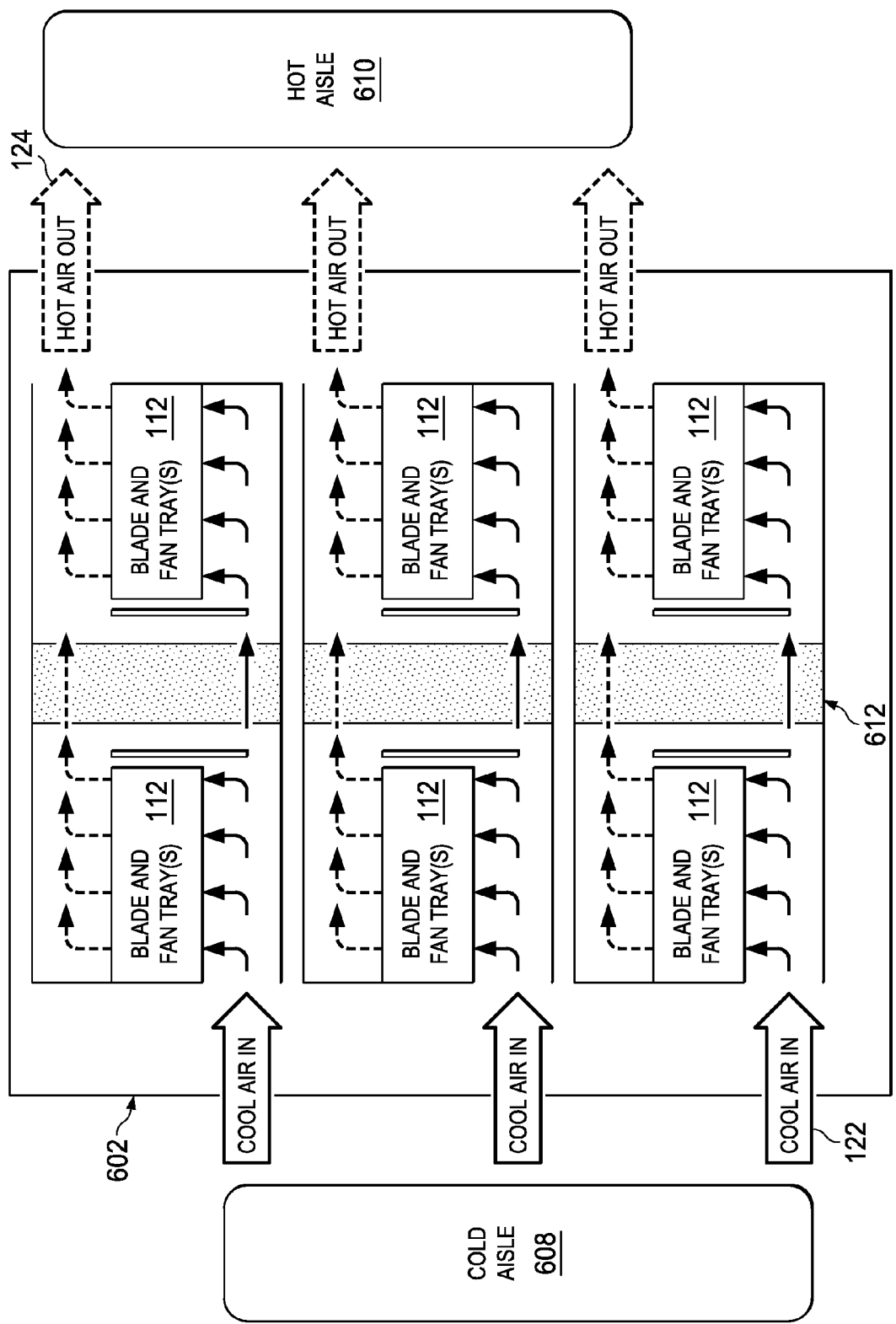
FIG. 6 is an example illustration of a pair of chassis connected by a fan tray module in accordance with an embodiment.

FIG. 6 is an example illustration of a pair of chassis connected by a fan tray module in accordance with an embodiment. Cabinet 602 includes six chassis in three pairs. Each pair includes a first chassis and a second chassis. FIG. 6 is somewhat similar to FIGS. 4-5, where a fan module tray 612 is also provisioned in this example implementation.

Fan tray module 612 may be installed between the first chassis and the second chassis. Furthermore, fan tray module 612 has an effective air seal between the plenums and moves air in the direction from the cold aisle to the hot aisle. The hot air exhaust plenums of each pair of chassis are also coupled at the rear with fan tray module 612. Fan tray module 612 has an effective air seal between plenums and moves air in the direction from the cold aisle to the hot aisle. Fan tray module 612 between the each pair of chassis may have airflow isolation between the fans serving the cold air intake plenum and the hot air exhaust plenum.

Figure 7:
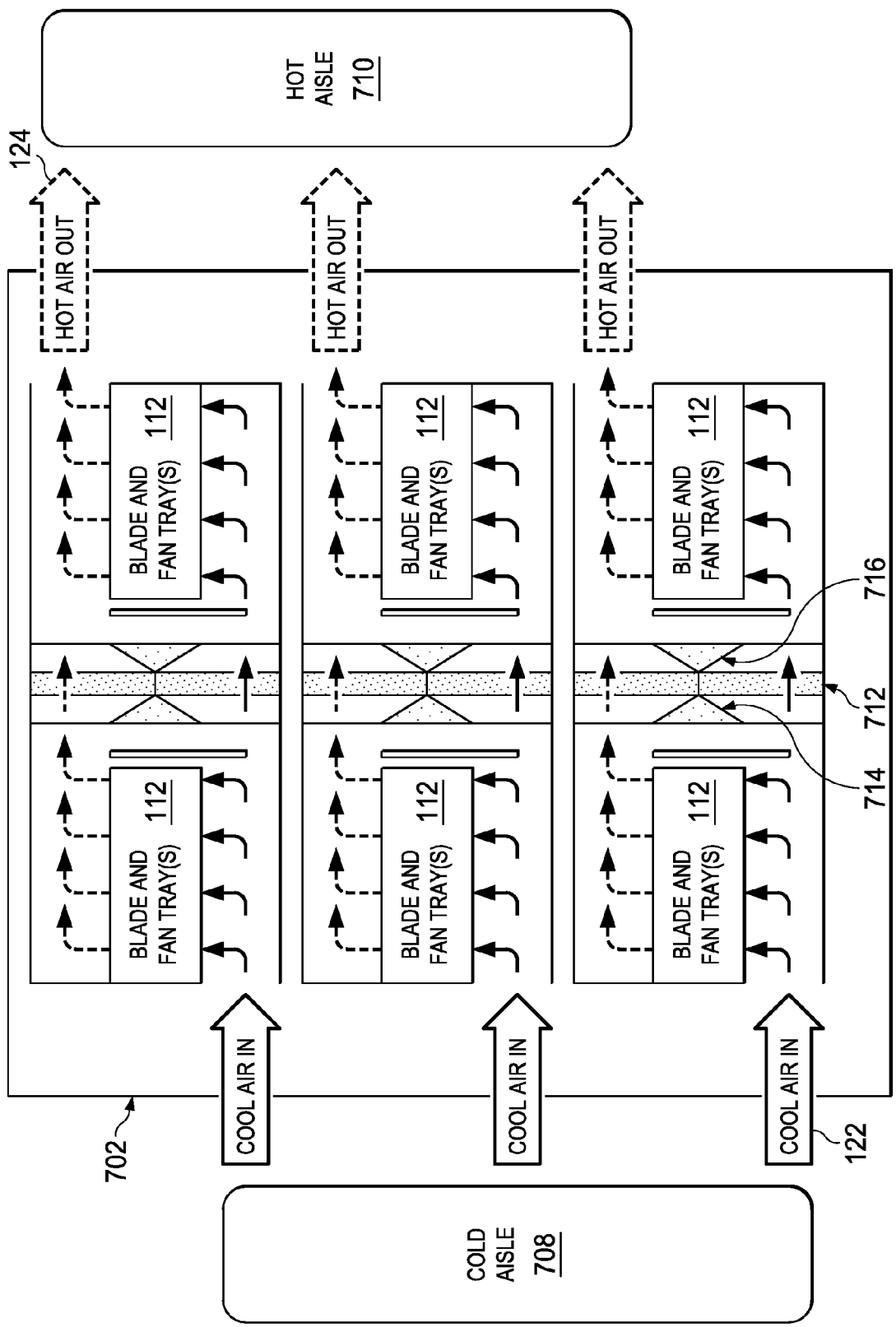
FIG. 7 is an example illustration of a pair of chassis connected by a fan tray module with an isolation area in accordance with an embodiment.

FIG. 7 is an example illustration of a pair of chassis connected by a fan tray module with an isolation area in accordance with an embodiment. Cabinet 702 includes six chassis in three pairs. Each pair includes a first chassis and a second chassis. FIG. 7 is somewhat similar to FIGS. 4-6, where a fan module tray 712 is also being provisioned and which may be combined with one or more isolation areas 714, 716.

Fan tray module 712 may be inserted between the rears of each chassis. Fan tray module 712 has an effective air seal between intake plenums 108 of the pair of chassis and moves air in the direction from the cold aisle to the hot aisle. The hot air exhaust plenums of both chassis are also coupled at the rear with fan tray module 712 with larger fans than, for example, fan tray module 612. Fan tray module 712 moves air in the direction from the cold aisle to the hot aisle.

Fan tray module 712 between the two chassis may include multiple isolation areas 714, 716. Isolation areas 714, 716 may be airflow isolation between the fans serving the cold air intake plenums 108 and hot air exhaust plenums 110. Isolation area 714 between the first chassis facing the cold aisle and fan tray module 712 may expand. This isolation area 716 between the second chassis facing the hot aisle and fan tray module 712 may contract. The expansion and contraction would allow the use of large diameter fans that provide power efficiency and acoustic noise level advantages.

Figure 8:
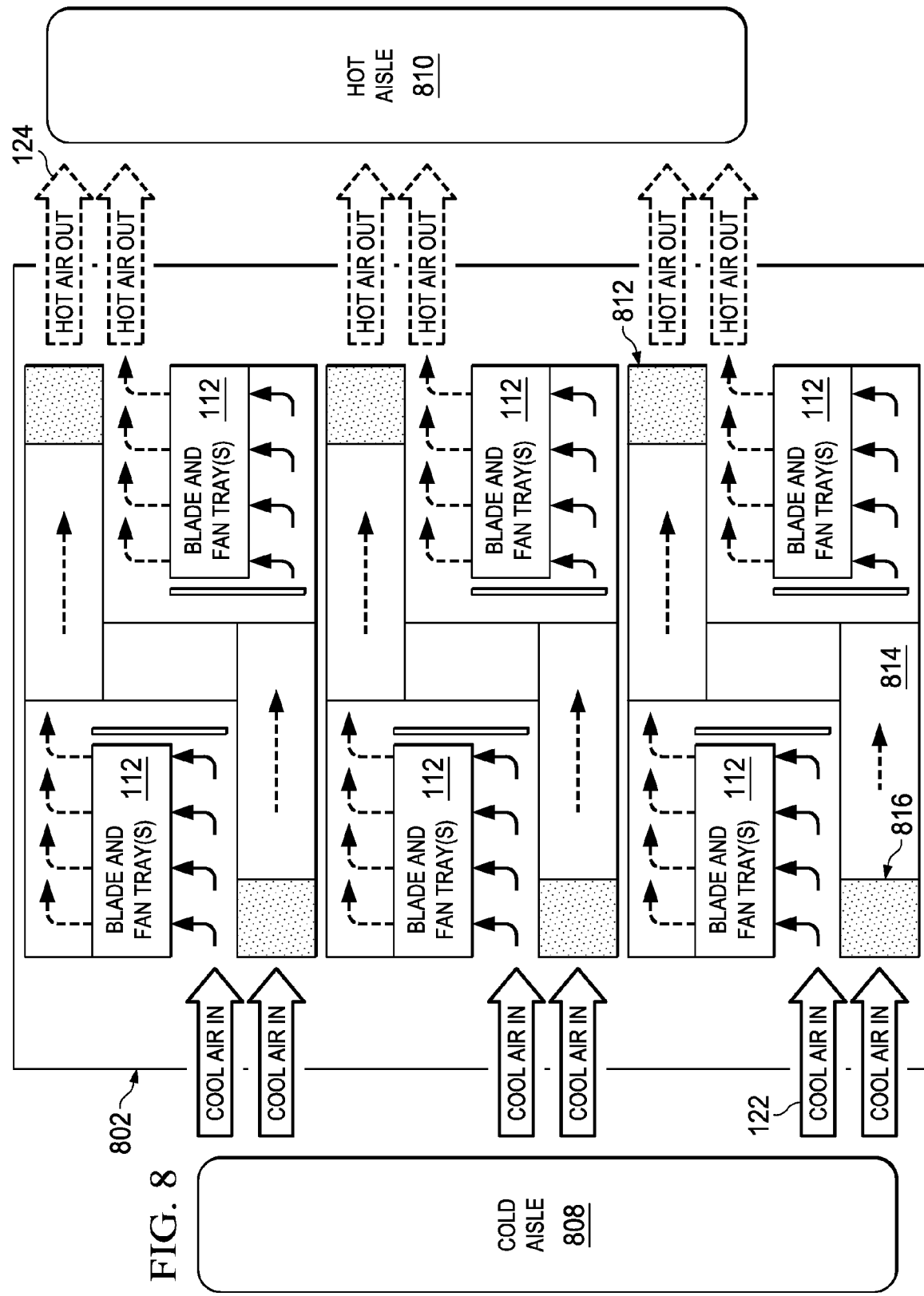
FIG. 8 is an example illustration of a pair of chassis offset and using fan modules in accordance with an embodiment.

FIG. 8 is an example illustration of a pair of chassis offset and using fan modules in accordance with an embodiment. Cabinet 802 includes six chassis in three pairs. Each pair includes a first chassis and a second chassis. FIG. 8 is somewhat similar to FIGS. 4-7, where these particular implementations also include one or more ducts being provisioned in the chassis.

The first chassis faces the cold aisle and the second chassis faces the hot aisle. In an embodiment, solid airflow management components may be installed at the front of the hot air exhaust plenum and the rear of the cold air intake plenum of the first chassis. The second chassis may have solid airflow management components installed at the front of the cold air intake plenum and the rear of the hot air exhaust plenum.

In an embodiment, the first chassis would be offset vertically to allow for an exhaust duct 812 to carry air from the rear of the hot air exhaust plenum of the first chassis to the hot aisle. The vertical offset may also allow an intake duct 814 to carry air from the cold aisle to the rear of the cold air intake plenum of the second chassis. The ducts may be passive without fan modules or active with fan modules 816.

Figure 9:
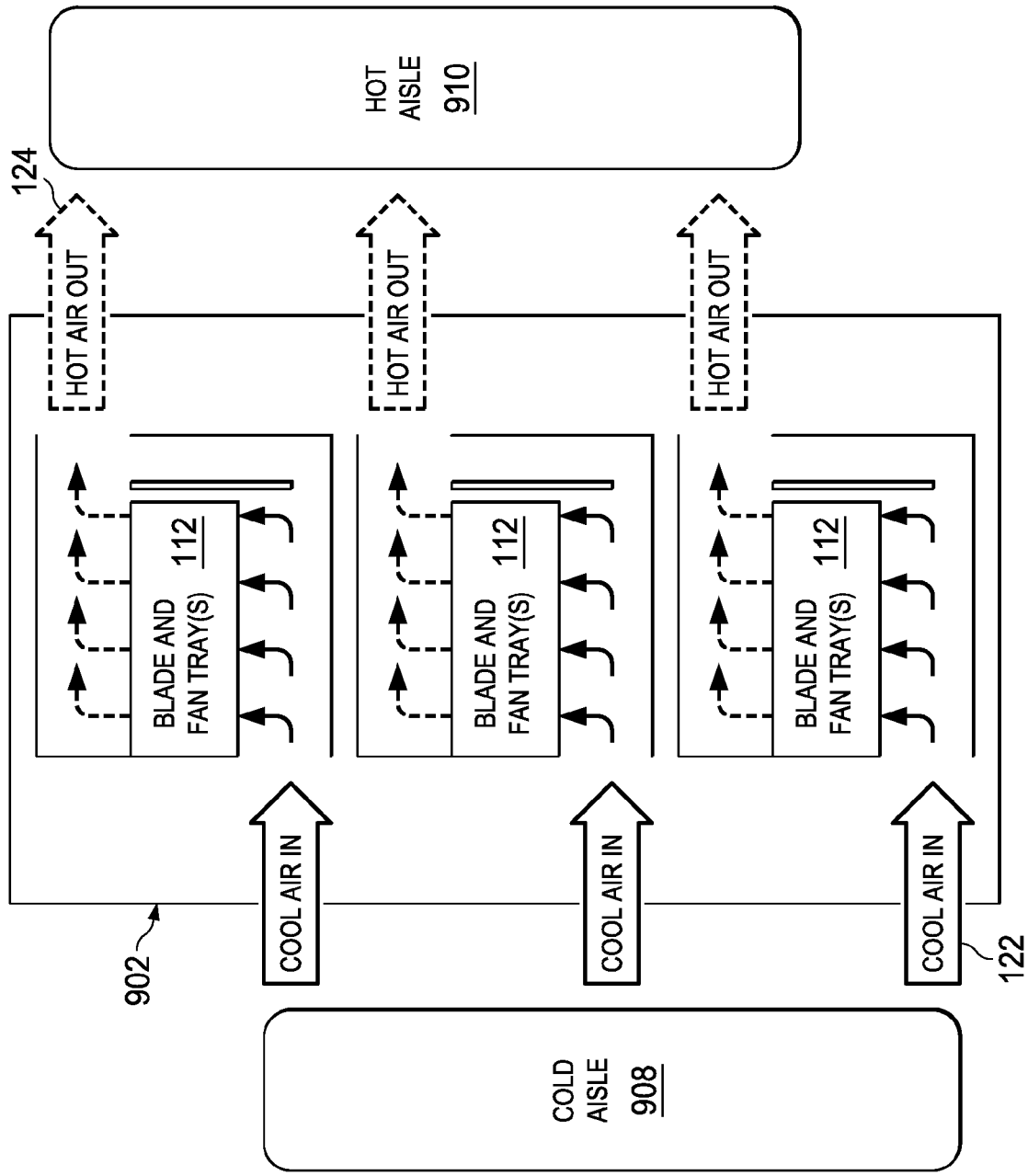
FIG. 9 is an example illustration of a plurality of chassis facing a cold aisle in accordance with an embodiment.

FIG. 9 is an example illustration of a plurality of chassis facing a cold aisle in accordance with an embodiment. Cabinet 902 includes three chassis in this particular example. The chassis faces the cold aisle. In an embodiment, solid airflow management components may be installed at the front of the hot air exhaust plenum and the rear of the cold air intake plenum of the chassis.

Figure 10:
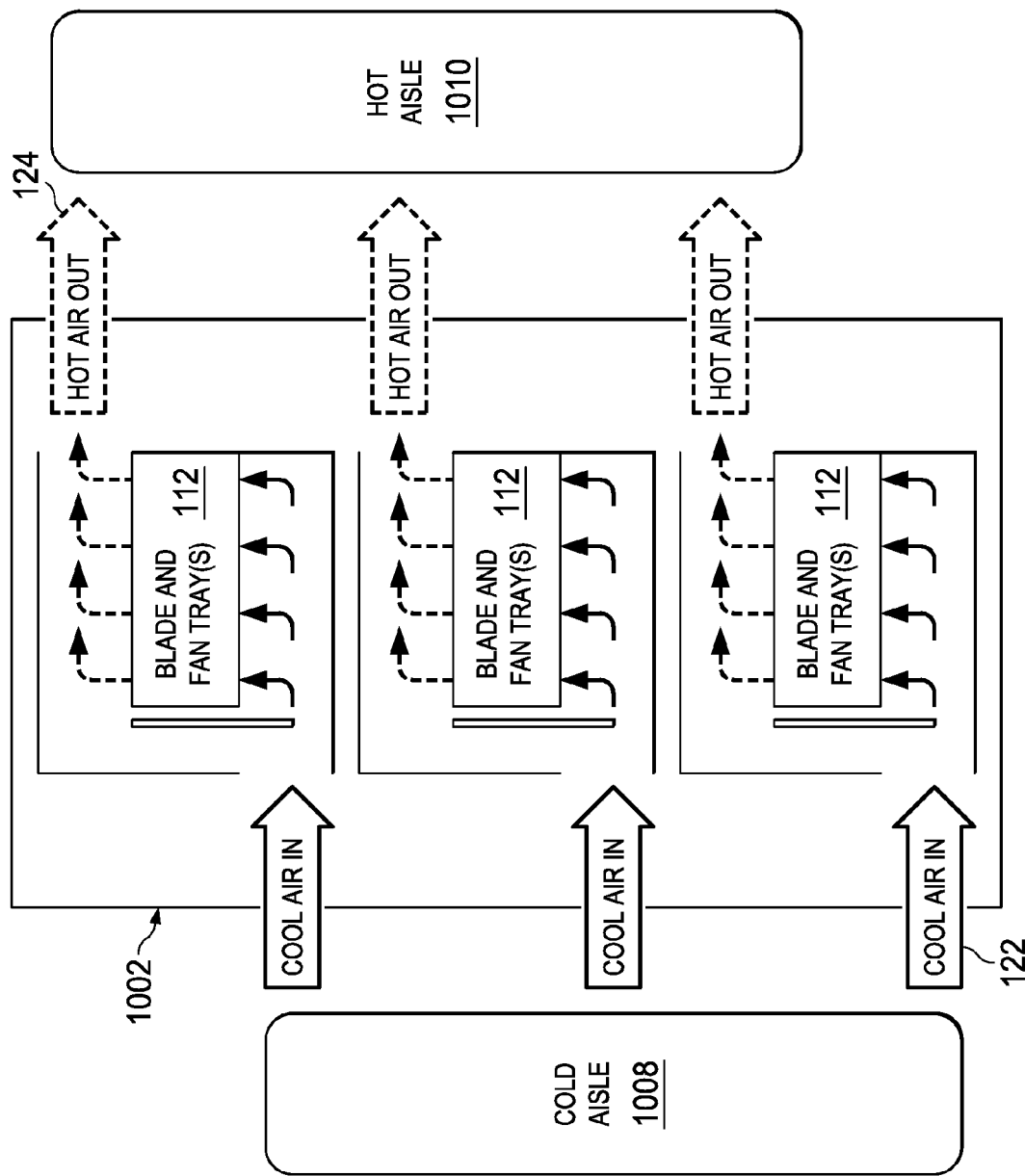
FIG. 10 is an example illustration of a plurality of chassis facing a hot aisle in accordance with an embodiment.

FIG. 10 is an example illustration of a plurality of chassis facing a hot aisle in accordance with an embodiment. Cabinet 1002 includes three chassis in this particular example implementation. The chassis faces the hot aisle. In an embodiment, the chassis may have solid airflow management components installed at the front of the cold air intake plenum and the rear of the hot air exhaust plenum.

Figure 11:
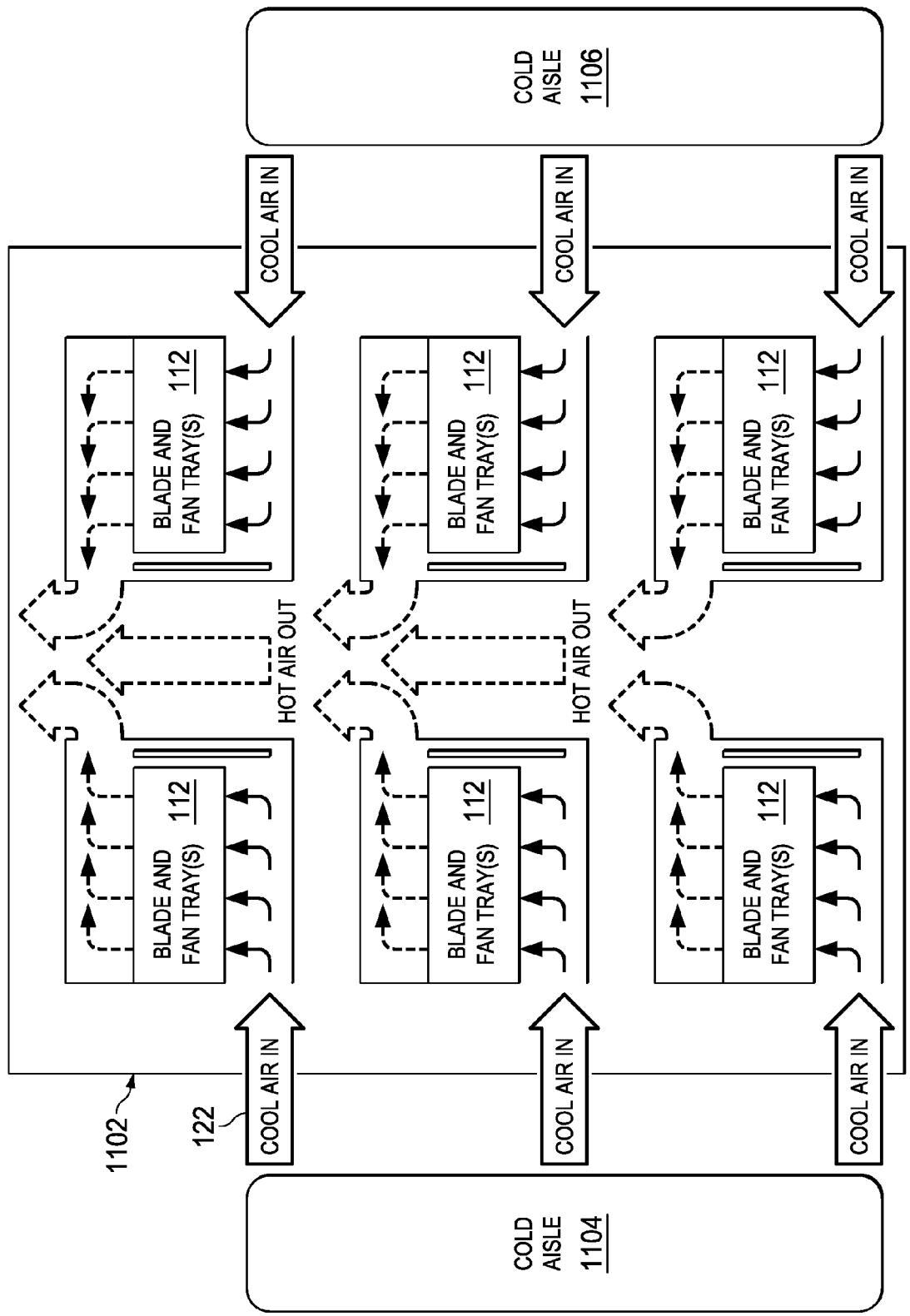
FIG. 11 is an example illustration of a plurality of chassis between two cold aisles in accordance with an embodiment.

FIG. 11 is an example illustration of a plurality of chassis between two cold aisles in accordance with an embodiment. Cabinet 1102 includes six chassis in three pairs in this particular example implementation. Each pair includes a first chassis and a second chassis. The first chassis faces a first cold aisle 1104 and the second chassis faces a second cold aisle 1106. In an embodiment, solid airflow management components may be installed at the front of the hot air exhaust plenum and the rear of the cold air intake plenum of the first chassis. The second chassis may have solid airflow management components installed at the front of the hot air exhaust plenum and the rear of the cold air intake plenum. In this embodiment, hot air may exit through exhaust plenums into the center of cabinet 1102. Additionally, the hot air may be pulled out through a center-venting unit or through some other suitable removal method.

Figure 12:
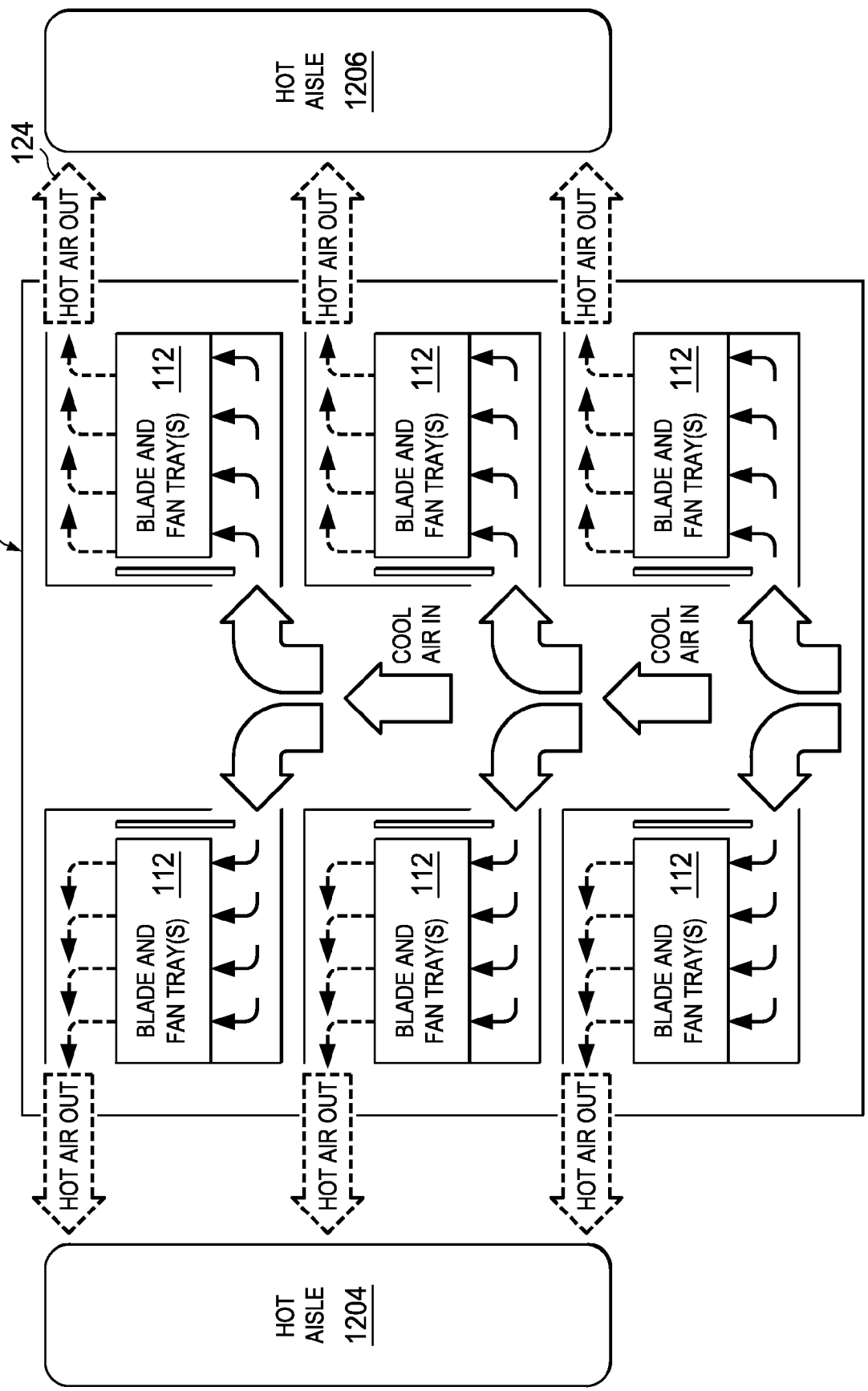
FIG. 12 is an example illustration of a plurality of chassis between two hot aisles in accordance with an embodiment.

FIG. 12 is an example illustration of a plurality of chassis between two hot aisles in accordance with an embodiment. Cabinet 1202 includes six chassis in three pairs in this particular example implementation. Each pair includes a first chassis and a second chassis. The first chassis faces a first hot aisle 1204 and the second chassis faces a second hot aisle 1206. In an embodiment, solid airflow management components may be installed at the front of the cold air intake plenum and the rear of the hot air exhaust plenum of the first chassis. The second chassis may also have solid airflow management components installed at the front of the cold air intake plenum and the rear of the hot air exhaust plenum. In this embodiment, the cold air may enter each chassis through the intake plenums from the center of cabinet 1202. Additionally, the cold air may be pushed into the center of cabinet 1202 through a suitable venting method.

Figure 13:
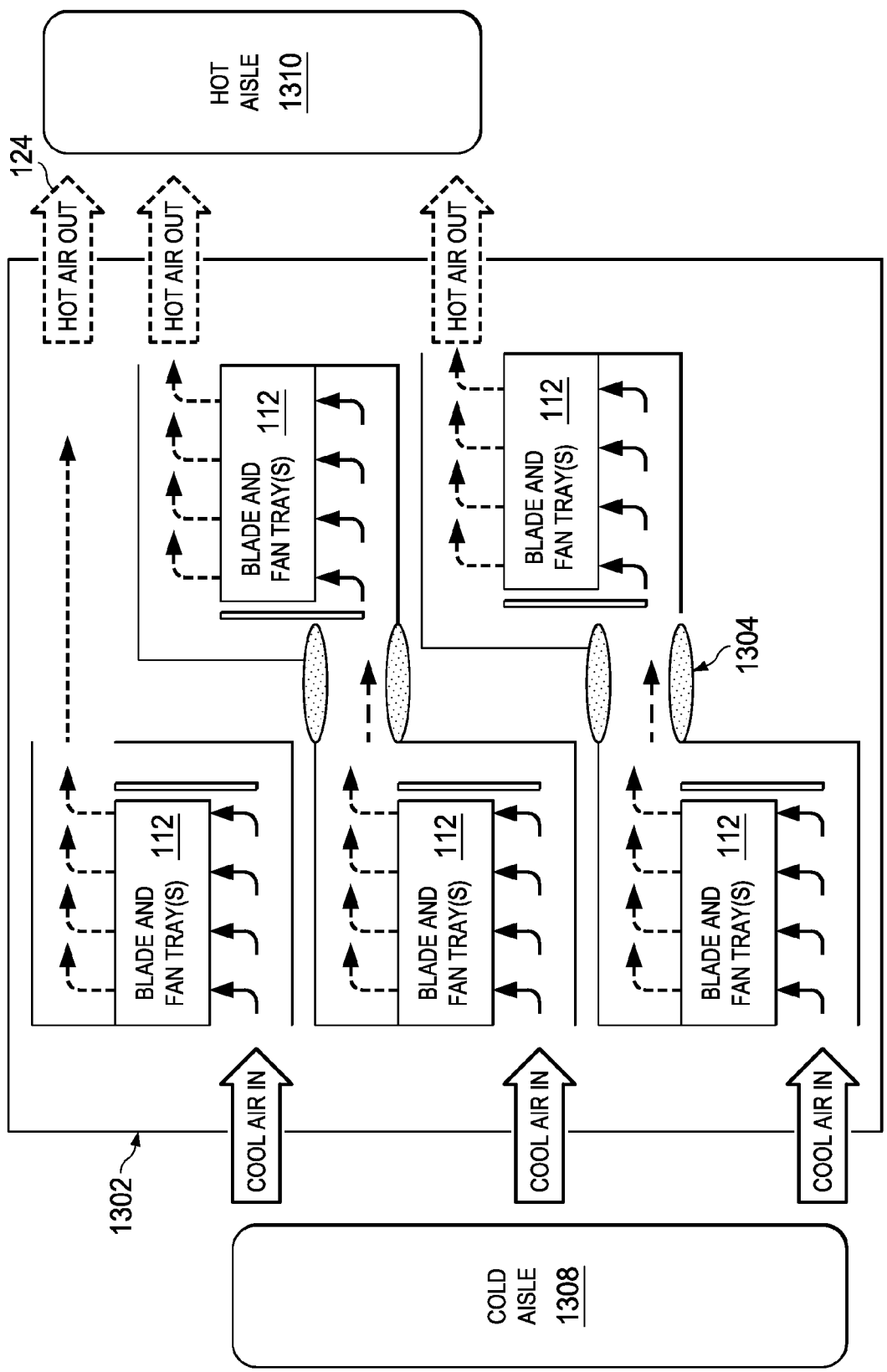
FIG. 13 is an example illustration of a pair of chassis with an exhaust plenum in a first chassis coupled to an intake plenum in a second chassis in accordance with an embodiment.

FIG. 13 is an example illustration of a pair of chassis with an exhaust plenum in a first chassis coupled to an intake plenum in a second chassis in accordance with an embodiment. Cabinet 1302 includes five chassis of two pairs and a solo chassis in this particular example implementation. Each pair includes a first chassis and a second chassis. The first chassis faces the cold aisle and the second chassis faces the hot aisle. In an embodiment, solid airflow management components may be installed at the front of the hot air exhaust plenum and the rear of the cold air intake plenum of the first chassis. The second chassis may have solid airflow management components installed at the front of the cold air intake plenum and the rear of hot air exhaust plenum.

In an embodiment, the second chassis would be offset vertically to allow for the exhaust plenum of the first chassis to be coupled with coupling mechanism 1304 to the intake plenum of the second chassis. The plenums may be coupled by any coupling mechanism described in this disclosure, such as, for example, a gasket, duct, fan module, or any other suitable coupling mechanism 1304. The single first chassis that does not have a paired second chassis releases hot air from the exhaust plenum into the hot aisle.

Figure 14:
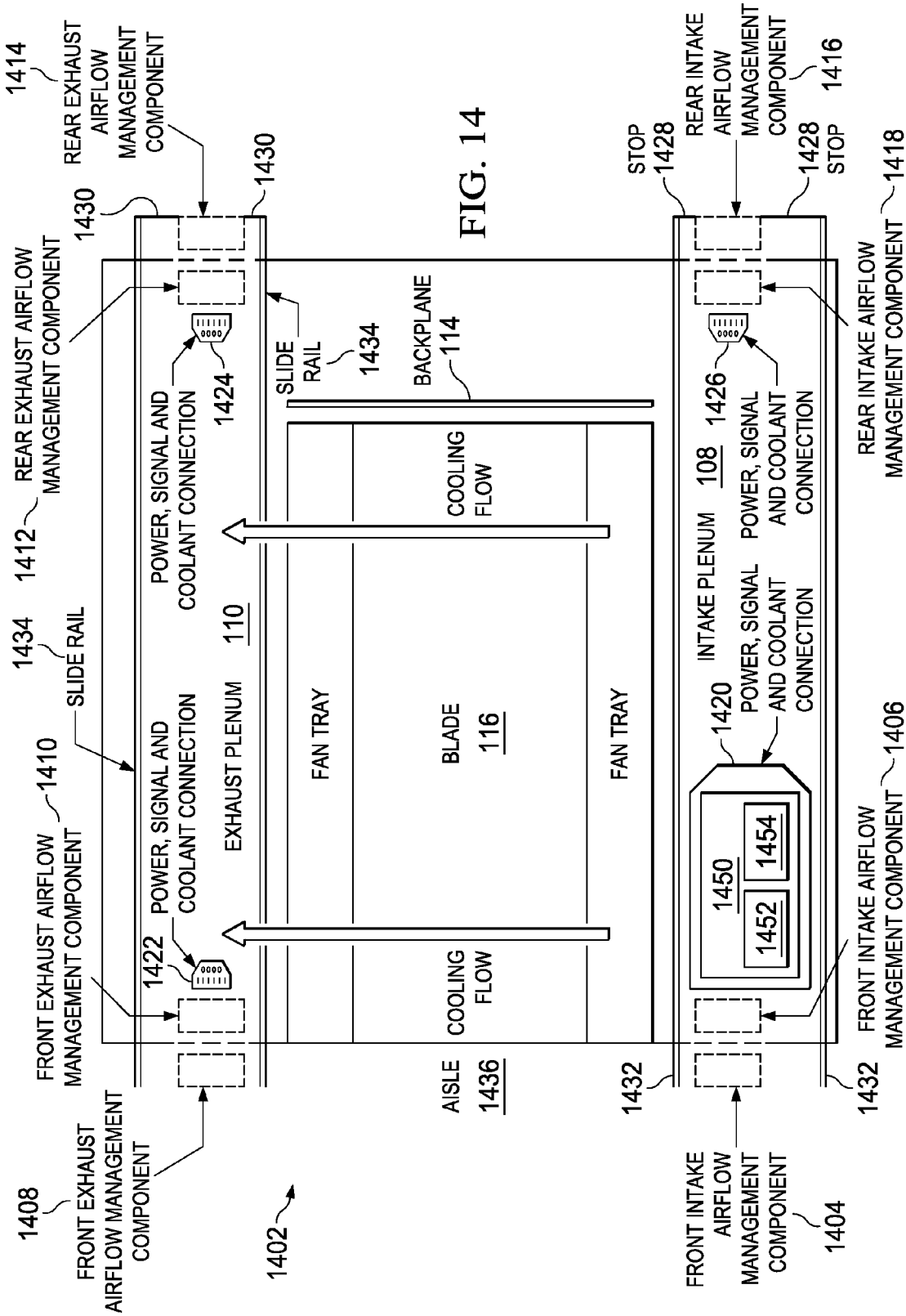
FIG. 14 is an example illustration of a side view of a chassis with an airflow management system in accordance with an embodiment.

FIG. 14 is an example illustration of a side view of a chassis with an airflow management system in accordance with an embodiment. Airflow management system 1402 includes intake plenum 108, exhaust plenum 110, blade system 112, backplane 114, number of airflow management components 1404-1418, connections 1420-1426, stops 1428-1430, and side rails 1432-1434. Blade system 112 further includes blades 116, fan tray 118, and fan tray 120. Airflow management system 1402 may be located next to aisle 1436, which may be a hot or cold aisle. Airflow management system 1402 enables a user to configure an electronic chassis to be used in a number of configurations. Removable stops 1428-1430 at the rear ends of the slide rails prevent airflow management components 1404-1418 from being pushed off rails 1432-1434 into a potentially inaccessible area behind the chassis.

A subset of airflow management components 1404-1418 may require connections to the shelf, which can be accomplished via either blind mate connectors or flying cables, mating with connectors 1420-1426 in the plenum. These connections may connect sensors on the modules (such as temperature, pressure, humidity, or flow) to shelf level management controllers. In some cases like fans, a significant amount of electrical power is also carried on this connector. Finally, in the special case of an air-liquid heat exchanger, a pair of medical-grade leak-proof fluid connectors carries the coolant onto and off the heat exchanger component. Connectors 1420-1426 may be inset into the plenum walls to permit rear airflow management components 1412-1418 to slide past them on slide rails 1432-1434.

The configuration of airflow management system 1402 may be implemented through a shelf management unit 1450. The shelf management unit may include a processor 1452 and a memory 1454. In this example, the shelf management unit 1450 is shown connected to only connection 1420; however, the shelf management unit may be connected to any number of connections 1420-1426. Furthermore, there may be more shelf management units 1450, for example, one for each connection 1420-1426. Additionally, the shelf management unit 1450 may be located in the plenums 108, 110, the blade system 116, outside of airflow management system 1402, or any other suitable location.

Processor 1452 serves to execute instructions for software that may be loaded into a system memory 1454. Processor 1452 may be a number of processors, a multi-processor core, or some other type of processor, depending on the particular implementation. Further, processor 1452 may be implemented using a number of heterogeneous processor systems in which a main processor is present with secondary processors on a single chip. Memory 1454 is any piece of hardware that is capable of storing information, such as, for example, without limitation, data, program code in functional form, and/or other suitable information on either a temporary basis and/or a permanent basis.

In an embodiment, airflow management components 1404-1418 may be a number of different airflow management components. The airflow management components may include, but not limited to, a solid cover, a perforated cover, a filter cover, a booster fan module, an air to liquid heat exchanger module (i.e., device designed to transfer heat from one medium to another, in which the media could be separated by a barrier), a duct muffler, a duct connection, and a cable management cover. The duct connection may be round, square, or some other suitable shape. The duct muffler may have some sound absorbing material to attenuate any noise moving through the corresponding duct. The booster fan module may be electrically powered fan that can draw more air through the ducts.

A solid cover may be a solid plate that blocks the entire plenum, preventing any air from passing. This may be used in situations where one end of a plenum should be blocked, typically to direct the air to the opposite end of the plenum. This is particularly useful for double-sided shelf installations. Each of these may have an identical outer frame size, permitting it to be installed snugly across the front or back of either plenum. The perimeter of the frames may treated with two types of seals, one intended to block stray electromagnetic signal propagation through what would otherwise be a slot antenna, and the other intended to block air from being lost through the cracks. A positive retention mechanism permits the components to slide freely in the plenum until a lock is engaged, at which time the component is rigidly held in place.

A perforated cover may have the same dimensions as the solid cover, but includes perforations such as a honeycomb filter or circular punch or rectangular or honeycomb punch pattern that permit free passage of air. The geometry of the perforations is selected to create the least obstruction to flow, while still blocking the EMC frequencies of interest, and serving as an effective finger guard in the case where fans are installed behind it. This cover may include sensor capabilities to measure temperature or flow.

A filter cover may also have the same dimensions as the solid cover, but includes a filter element to arrest dust and other contaminants. This may be the outer element in an air intake plenum, as it may need to be accessible for regular service. It may include sensors that measure differential pressure in front of and behind the element in order to predict when it needs to be cleaned or changed. A variant of this could include piano roll style supply and take-up rolls of filter media, and a small motor to move fresh media into place whenever required. The filter may also have a 3D geometry such as a corrugated or trapezoidal shape to increase filter surface area.

Some cooling paths have significant pressure drop. In these cases, it is valuable to install booster fans in the plenums to provide extra pressure or flow. Booster fans can assist in apportioning airflow, for example by allowing independent throttle settings in a shared plenum between the fans driving air through a column of boards in a first chassis and a different set of fans driving the air to a back-to-back chassis. Finally, booster fans can assist in fault tolerance, operating at high power if other cooling fans in the airflow path should fail. Fan modules might include sensors for temperature, pressure, and flow. Fan modules can also include tachometers to measure the speed, and power monitors to measure the energy consumption of each individual fan, in order to predict impending fan failures. They respond to control commands to regulate the power to each fan and set its speed.

In challenging thermal environments, it may be desirable to move the cooling of the air from a centralized computer room air conditioning unit shared by dozens of cabinets to individual liquid to air heat exchangers in each shelf. This may be a micro-channel plate type of heat exchanger (basically, a highly efficient version of a car radiator) that accepts a coolant from a central source (such as chilled water, pumped refrigerant, or evaporative refrigerant), and removes heat from the air passing through it. A full complement of sensors may be required, including flow, pressure; and temperature and humidity on both sides of the exchanger. A valve actuated by a servo, solenoid, or other typical actuator may adjust the coolant flow to achieve the desired output temperature set point. This algorithm takes great care to stay above the dew point of the incoming air, so no condensation forms. If fault tolerance is desired in coolant sources, two of these Air to Liquid Heat Exchangers may be installed in the same plenum in series, each connected to independent coolant and control systems In certain cases, the large number of high power fans in a system creates unacceptable loud acoustic emissions, violating Occupational Safety and Health Administration or Network Equipment Building System requirements. This noise can be partially mitigated by installing a muffler in the ducts (typically the exhaust duct, but it may be used in intake ducts too in extreme cases). These mufflers could consist of various resonators and damping materials, or could employ loudspeakers and anti-noise techniques.

In certain scenarios, it may be desirable to connect intake and/or exhaust ports of a high power system directly to the air ducts associated with the wire center's room-level cooling system. Using a round duct connector, it is possible to avoid the mixing, efficiency loss, and acoustic noise associated with using the habitable space of a wire center as an air plenum. This component is basically the same as a solid cover, but with a number of round, rectangular, or other suitable shape holes, and collars to attach either rigid or flexible air ducts. These ducts could connect to under floor air distribution, ceiling mounted air plenums, or frame-level cooling solutions. If fault tolerance or the ability to select from different air sources (such as outside air vs. Computer room air conditioning supplied air), all ports can go to different air systems. The duct connection can include flow, temperature and humidity sensors for each duct, as well as servo controlled butterfly dampers to individually throttle the various flows.

The high-density systems illustrated by embodiments of this disclosure may sometimes have hundreds of cables emanating from their faceplates. If these cables are not carefully managed and secured, system maintenance can be complicated. A cable management cover is similar to the solid cover, but includes a horizontal cable tray outside the plenum capable of managing hundreds of CAT5/7 cables. Different cable tray dimensions could be options to manage different numbers of cables. Another option may be special cable management features for fiber optic cables that limit their bend radius to acceptable levels. The left and right ends of the cable tray may terminate at vertical cable trays that direct cables up and down the rails of the cabinet.

Combinations of two or more of these airflow management components 1404-1418 could be installed at one or both ends of each plenum on a modular shelf. A typical example for a medium power shelf may have a filter cover and perforated cover on the air intake, and a booster fan and perforated cover on the exhaust. A high power shelf may include a filter cover, air-liquid pre-cooler and booster fan on the intake, and a booster fan, air-liquid post cooler and duct muffler on the exhaust. Double-sided chassis installations could have even more complex configurations.

In operational terms, and in terms of one particular embodiment, a convertible modular electronic chassis has at least two cooling air plenums, one for cool intake air, and one for hot exhaust air. In an embodiment, said chassis is an AdvancedTCA shelf, which has a rectangular intake duct below an array of vertical blades, and a rectangular exhaust duct above the blades. Each of these ducts has an aperture in both the front and rear of the chassis. Depending upon the specific chassis and cabinet configuration, some of the apertures may be covered over by solid plates, or opened up to allow airflow. When airflow is allowed through an aperture, different airflow management components can be inserted into one or both ducts to customize the chassis cooling air management.

Both the intake and exhaust plenums have the ability to accept various airflow management components both in their front and rear regions. Each plenum is equipped with a slide rail system that permits the installation and securing of a plurality of airflow management components inside. To facilitate back-to-back shelf mounting (where the rear of a chassis may not be accessible), the airflow management components to be applied to the rear aperture can be slid from the front, deep inside the chassis, and secured in the rear. Air may pass through one or more airflow management components as it traverses each plenum including a front group of airflow management components that act on the air before it enters the central plenum and thence the board array, and a rear airflow management component group that acts on the air after it passes through the central plenum. A set of connectors in each plenum can provide power, management signals, and optionally liquid coolant circuits to airflow management components that may need these services. Any number of airflow, for example, up to three, management components can be installed in series in each group (depending upon their thickness and connectivity needs), although one or two may be more common. Removable stops at the rear ends of the slide rails prevent airflow management components from being pushed off the rails behind the chassis The various embodiments recognize that cooling and airflow management are becoming a large challenge in high-density modular electronic equipment. Completely different chassis and board designs may often be required for different airflow arrangements or directions. Providing multiple different chassis designs has a significant total cost of ownership penalty, including design, manufacturing, inventory, installation, maintenance, and operation.

Different use cases for a modular chassis may require different cooling capabilities. For example, in some installations, simple front-to-back airflow is adequate. In other installations, two systems are mounted back-to-back, and the system on the cold aisle side of a cabinet has an opposite airflow direction from the hot aisle system. Air filters can be provisioned, while in other environments, they provide unacceptable restrictions and, therefore, should not be used. Some systems require additional airflow or static pressure. In these situations, booster fans may be used. Some systems have unacceptable loud acoustic emissions, and some sort of muffler is helpful. Some systems may want to direct their inlet air, exhaust air, or both directly to floor mounted or overhead ducts without ever blowing it through the habitable space of the wire center. Finally, for very high thermal density systems, air-to-liquid heat exchangers may be valuable in meeting the extreme cooling requirements.

In traditional chassis design, to meet all these variable requirements, many (totally) different designs would have to be created, inventoried, installed, and maintained. If a user wanted to change the cooling philosophy of a wire center (moving to hot aisle/cold aisle, or adding liquid cooling at the frame level, for example), it may be necessary to completely remove a chassis, pull its boards, install them into a different type of chassis, and reinstall that into the wire center. This is expensive, wasteful, and disruptive.

What is needed therefore is a system to use a common basic chassis, but permit the addition of various airflow management components as FRUs in order to permit custom cooling configurations and adapt the cooling configuration of the chassis as the wire center evolves. The various embodiments provide these configuration options as show in this disclosure.

For the embodiments of FIGS. 4-14, the cabinets described may be different sizes, for example, 800 mm deep, 400 mm deep, or some other suitable depth. Additionally, for the purposes of this disclosure, a 14RU AdvancedTCA chassis without RTM (a PICMG standard for modular electronic packaging) may be used as an example embodiment. In this example, AdvancedTCA blades are 280 mm deep from faceplate to backplane connector. With blades of this depth, a way to achieve high volumetric density is to install two chassis back-to-back in an 800 mm deep cabinet. A similar scenario could be conceived with other systems in 800 mm, 1000 mm, or even deeper cabinets. Installing chassis back-to-back is currently not possible in a hot aisle cold aisle configuration, because the required airflow directions would conflict. This disclosure relates to a method to provide much versatility in configuration of a system's chassis, to permit it to achieve higher system and thermal densities.

Additionally, in other embodiments, electronic chassis may include a rack-mount system. Furthermore, fan trays 118, 120 represented in FIGS. 3-14 may be horizontal. However, in other embodiments, fan trays 118, 120 may be vertical or in other configurations.

Additionally, PICMG 3.7 also known as ATCA Extension standard is in the draft stage (not publicly available at the time of this patent filing). This standard defines a "two-sided" chassis with a variety of mid-plane configurations to allow for PICMG 3.0 compliant blades and newly defined PICMG 3.7 compliant Extended Transition Modules. This is currently being defined as a single large form factor chassis, which can be expensive for a customer performing an initial deployment. Currently, the standard does not describe a "pay as you grow" scenario where a deployment could install the "front" half of a system until a point is reached where additional payload capacity is needed from the chassis and a "rear" half of the chassis could be installed.

An embodiment of this disclosure allows two individual "modular" ATCA chassis to be joined to form a single ATCA Extensions chassis. To use the same chassis in both positions, the embodiments of this disclosure may be incorporated in the modular chassis concept for back-to-back installation as described herein and having various modular components at the front and rear of chassis plenums as described herein.

In another aspect of this disclosure, a single rigid assembly may be provided. The assembly may be a machined or cast metal frame with precision-machined holes in which alignment dowels may be installed with an interference fit and the frame may include bosses on both sides with drilled and tapped holes. The bosses may be on both sides of the assembly. The top surfaces of the bosses can be precision machined such that all surfaces are parallel and fixed at a distance of 36 mm. The datum plane of the bosses on both sides may adhere to a geometric tolerance.

In addition to the aforementioned frame assembly, a device, either integral to the frame or separate can seal the opening between zone 3 (as described in PICMG 3.0) of both front and rear chassis with regards to EMC considerations and also airflow considerations.

This allows a "pay as you grow" deployment model. This also allows for fewer parts (top-level chassis assemblies) for engineers to design, for supply chains to manage, and for support services to manage. This device allows for a lower TCO for customers. Additionally, this allows for a single chassis to be deployed or a coupled large chassis to be installed for different applications. Furthermore, a PICMG 3.0 compliant chassis can be re-used for conversion into a PICMG 3.7 compliant chassis that requires utilization of Extended Transition Modules.

Figure 15:
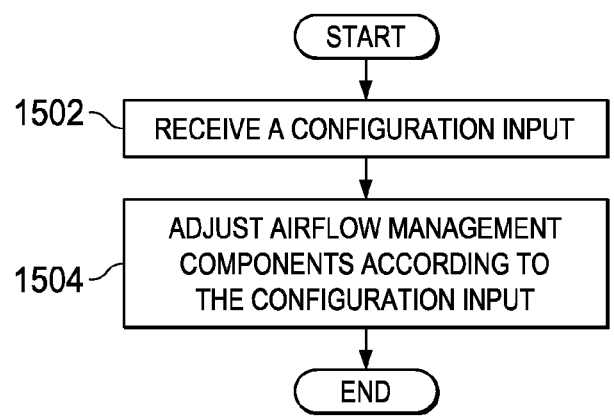
FIG. 15 is a simplified flowchart illustrating method for configuring airflow in an electronic chassis in accordance with an embodiment.

FIG. 15 is a simplified flowchart illustrating a method for configuring airflow in an electronic chassis in accordance with an embodiment. The flow may begin at 1502, when the electronic chassis receives a configuration input. The configuration input may be performed by the user, sensed automatically by the chassis, or predetermined. The configuration input may relate to the number of airflow management components, such as, for example, the components described in FIG. 14. Among other instructions, the configuration input may provide power levels, management signals, and liquid coolant settings to the number of airflow management components.

At 1504, the electronic chassis adjusts a plurality of airflow management components in an electronic chassis according to the configuration input. Adjusting the number of airflow management components may include setting a speed of a fan in the booster fan module and setting a direction of the fan in the booster fan module, a damper position, and/or a coolant flow for the air to liquid heat exchanger module. By setting the coolant flow, the temperature may be indirectly set. Additionally, 1502 and 1504 may be performed in operation with a shelf management unit. The shelf management unit may receive the configuration input and send signals to adjust the number of airflow management components. Thereafter, the process ends.

Figure 16:
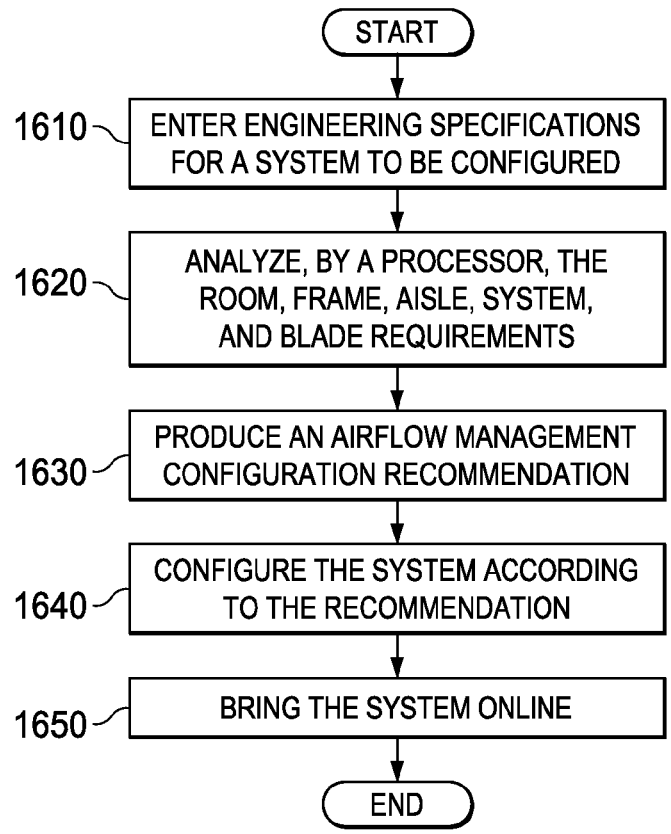
FIG. 16 is a simplified flowchart 1600 illustrating a method for configuring airflow in an electronic chassis with an automation system in accordance with an embodiment.

FIG. 16 is a simplified flowchart illustrating a method for configuring airflow in an electronic chassis with an automation system in accordance with an embodiment. The flow may begin at 1610, by entering the engineering specifications for a system to be configured. A user may enter in the specifications, for example. Next, a computer system analyzes room, frame, aisle, system, and blade requirements at 1620. Then, the computer system, at 1630, produces airflow management component configuration recommendation. Next, at 1640, the installer configures the system per the recommendation made by the computer system. Finally, at 1650, the system is brought online. Thereafter, the process ends.

Figure 17:
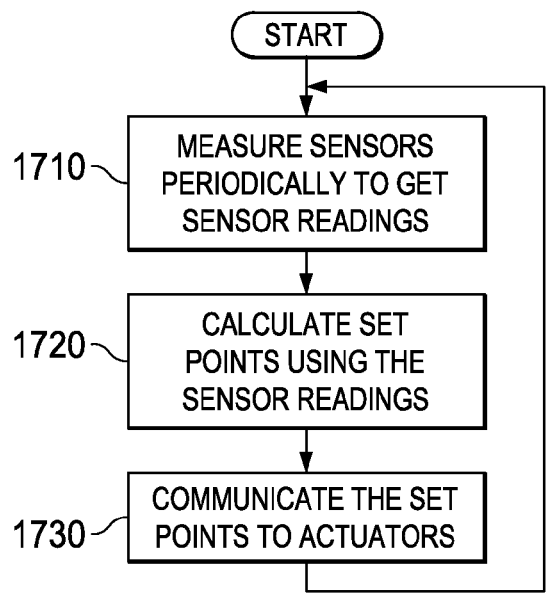
FIG. 17 is a simplified flowchart 1700 illustrating a method for configuring airflow in an electronic chassis with an automation system in accordance with an embodiment.

FIG. 17 is a simplified flowchart illustrating a method for configuring airflow in an electronic chassis with an automation system in accordance with an embodiment. Once the system becomes operational, an automatic, closed-loop control system may be entered. During the closed-loop, sensors are interrogated, and the various valves, dampers, and fan speeds are set to provide the optimal cooling performance. This loop may be executed several times per second for the active life of the system The flow may begin at 1710, where the system periodically measures sensors (temperature, pressure, humidity, flow, etc.). Next, at 1720, control software uses sensor readings to calculate set points. Then, at 1730, set points are communicated to actuators (fan speed, damper position, liquid coolant flow, etc.). Finally, the process repeats itself by returning to 1710. Additionally, 1710 through 1730 may be performed in operation with a shelf management unit. The shelf management unit may operate the control software to measure the sensors, calculate the set points, and communicate the set points to the actuators.

Note that in certain example implementations, the configuring airflow in an electronic chassis functions outlined herein may be implemented by logic encoded in one or more tangible, non-transitory media (e.g., embedded logic provided in an application specific integrated circuit [ASIC], digital signal processor [DSP] instructions, software [potentially inclusive of object code and source code] to be executed by a processor, or other similar machine, etc.). In some of these instances, a memory element can store data used for the operations described herein. This includes the memory element being able to store software, logic, code, or processor instructions that are executed to carry out the activities described in this Specification. A processor can execute any type of instructions associated with the data to achieve the operations detailed herein in this Specification. In one example, the processor could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array [FPGA], an erasable programmable read only memory (EPROM), an electrically erasable programmable ROM (EEPROM)) or an ASIC that includes digital logic, software, code, electronic instructions, or any suitable combination thereof.

In one example implementation, electronic chassis described in FIGS. 3-15 may include software in order to achieve the forwarding determination functions outlined herein. Electronic chassis described in FIGS. 3-15 can include memory elements for storing information to be used in achieving the intelligent forwarding determination activities, as discussed herein. Additionally, electronic chassis described in FIGS. 3-15 may include a processor that can execute software or an algorithm to perform operations, as disclosed in this Specification. These devices may further keep information in any suitable memory element [random access memory (RAM), ROM, EPROM, EEPROM, ASIC, etc.], software, hardware, or in any other suitable component, device, element, or object where appropriate and based on particular needs. Any of the memory items discussed herein (e.g., database, tables, trees, cache, etc.) should be construed as being encompassed within the broad term 'memory element.' Similarly, any of the potential processing elements, modules, and machines described in this Specification should be construed as being encompassed within the broad term 'processor.'

The first system may be an automated configuration tool that performs engineering analysis of configurations, and recommends optimal configurations of airflow management components for each customized installation. The second system may be the active control system that measures sensors and automatically sets the operational points of the cooling components in response to those readings.

Note that with the example provided above, as well as numerous other examples provided herein, interaction may be described in terms of two, three, or four elements. However, this has been done for purposes of clarity and example only. In certain cases, it may be easier to describe one or more of the functionalities of a given set of flows by only referencing a limited number of elements. It should be appreciated that electronic chassis described in FIGS. 3-15 (and its teachings) are readily scalable and can accommodate a large number of components, as well as more complicated/sophisticated arrangements and configurations. Accordingly, the examples provided should not limit the scope or inhibit the broad teachings of electronic chassis described in FIGS. 3-15 as potentially applied to a myriad of other architectures.

It is also important to note that the steps in the preceding flow diagrams illustrate only some of the possible scenarios and patterns that may be executed by, or within, an electronic chassis. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. An electronic chassis provides substantial flexibility in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus, comprising:
a housing having an exhaust plenum and an intake plenum, the exhaust plenum and the intake plenum each having a plurality of apertures, the plurality of apertures located at opposing ends of each of the exhaust plenum and the intake plenum;
at least one electronic blade system located between the exhaust plenum and the intake plenum;
a plurality of airflow management components that manage an airflow in the housing, the plurality of airflow management components including
a first airflow management component removably coupled to one of the plurality of apertures of the exhaust plenum, the first airflow management component being a component of a first group consisting of: a solid cover; a perforated cover; a filter cover; a booster fan module; an air to liquid heat exchanger module; a duct muffler; a duct connection; and a cable management cover, and
a second airflow management component removably coupled to one of the plurality of apertures of the intake plenum, the second airflow management component being a component of a second group consisting of: a solid cover; a perforated cover; a filter cover; a booster fan module; an air to liquid heat exchanger module; a duct muffler; a duct connection; and a cable management cover,
at least one first lock that engages to hold the first airflow management component, which covers the one of the plurality of apertures of the exhaust plenum; and
at least one second lock that engages to hold the second airflow management component, which covers the one of the plurality of apertures of the intake plenum.

2. The apparatus of claim 1, wherein the exhaust plenum and the intake plenum extend from a front end of the housing to a rear end of the housing.

3. The apparatus of claim 1, wherein the first airflow management component is a panel that covers the one of the plurality of apertures of the exhaust plenum, and the second airflow management component is a panel that covers the one of the plurality of apertures of the intake plenum.

4. The apparatus of claim 1, further comprising:
an additional airflow management component located at another aperture of at least one of the exhaust plenum or the intake plenum.

5. The apparatus of claim 1, further comprising:
a connector in at least one of the exhaust plenum or the intake plenum that provides at least one of power, management signals, or liquid coolant to the first airflow management component or the second airflow management component.

6. The apparatus of claim 1, further comprising:
a slide rail extending along a length of the housing and that accepts an airflow management component of the first airflow management component or the second airflow management component.

7. The apparatus of claim 6, further comprising:
a stop that prevents the airflow management component from being pushed off the slide rail.

8. The apparatus of claim 6, further comprising:
a connector that provides at least one of power, management signals, or liquid coolant to the airflow management component, wherein the connector is inset into a wall of at least one of the exhaust plenum or the intake plenum to permit the airflow management component to slide past the connector in the housing.

9. A system, comprising:
a cabinet;
a first chassis and a second chassis located within the cabinet, wherein each of the first chassis and the second chassis has an exhaust plenum and an intake plenum, the exhaust plenum and the intake plenum each having a plurality of apertures, the plurality of apertures located at opposing ends of each of the exhaust plenum and the intake plenum;
at least one electronic blade located between the exhaust plenum and the intake plenum of at least one of the first chassis or the second chassis;
a plurality of airflow management components that manage an airflow in the first chassis or the second chassis, the plurality of airflow management components including
a first airflow management component removably coupled to one of the plurality of apertures of the exhaust plenum of one of the first chassis or the second chassis, the first airflow management component being a component of a first group consisting of: a solid cover; a perforated cover; a filter cover; a booster fan module; an air to liquid heat exchanger module; a duct muffler; a duct connection; and a cable management cover, and
a second airflow management component removably coupled to one of the plurality of apertures of the intake plenum of another of the first chassis or the second chassis, the second airflow management component being a component of a second group consisting of: a solid cover; a perforated cover; a filter cover; a booster fan module; an air to liquid heat exchanger module; a duct muffler; a duct connection; and a cable management cover:
at least one first lock that engages to hold the first airflow management component, which covers the one of the plurality of apertures of the exhaust plenum of the one of the first chassis and the second chassis;

at least one second lock that engages to hold the second airflow management component, which covers the one of the plurality of apertures of the intake plenum of the another of the first chassis and the second chassis; and one of more coupler mechanisms that couple the first chassis to the second chassis.

10. The system of claim 9, wherein the exhaust plenum of the first chassis and the intake plenum of the first chassis extend from a front end to a rear end of the first chassis, and the exhaust plenum of the second chassis and the intake plenum of the second chassis extend from a front end to a rear end of the second chassis.

11. The system of claim 9, wherein the first airflow management component is a panel that covers the one of the plurality of apertures of the exhaust plenum of the one of the first chassis and the second chassis, and the second airflow management component is a panel that covers the one of the plurality of apertures of the intake plenum of the another of the first chassis and the second chassis.

12. The system of claim 9, wherein the one or more coupler mechanisms include a first gasket coupling the exhaust plenum of the first chassis to the exhaust plenum of the second chassis, and a second gasket coupling the intake plenum of the first chassis to the intake plenum of the second chassis.

13. The system of claim 9, wherein the one or more coupler mechanisms include a first fan module coupling the exhaust plenum of the first chassis to the exhaust plenum of the second chassis, and a second fan module coupling the intake plenum of the first chassis to the intake plenum of the second chassis.

14. The system of claim 9, wherein the one or more coupler mechanisms include a fan tray module coupling the exhaust plenum of the first chassis to the exhaust plenum of the second chassis, and the fan tray module couples the intake plenum of the first chassis to the intake plenum of the second chassis.

15. The system of claim 9, wherein the one or more coupler mechanisms include a fan tray module that couples the exhaust plenum of the first chassis to the exhaust plenum of the second chassis, the fan tray module couples the intake plenum of the first chassis to the intake plenum of the second chassis, and the fan tray module comprises:

a first isolation area that expands; and a second isolation area that contracts.

16. The system of claim 9, wherein the one or more coupler mechanisms include a duct system that comprises:

a first duct that extends the exhaust plenum of the first chassis; and a second duct that extends the intake plenum of the second chassis.

17. The system of claim 9, wherein the one or more coupler mechanisms couple the exhaust plenum of the first chassis to the intake plenum of the second chassis.

18. A method, comprising:

providing a housing having an intake plenum and an exhaust plenum, the exhaust plenum and the intake plenum each having a plurality of apertures, the plurality of apertures located at opposing ends of each of the exhaust plenum and the intake plenum;

providing an electronic blade system located between the intake plenum and the exhaust plenum;

providing a plurality of airflow management components that manage airflow in the housing, the plurality of airflow management components including a first airflow management component removably coupled to one of the plurality of apertures of the exhaust plenum, the first airflow management component being a component of a first group consisting of: a solid cover; a perforated cover; a filter cover; a booster fan module; an air to liquid heat exchanger module; a duct muffler; a duct connection; and a cable management cover, and a second airflow management component removably coupled to one of the plurality of apertures of the intake plenum, the second airflow management component being a component of a second group consisting of: a solid cover; a perforated cover; a filter cover; a booster fan module; an air to liquid heat exchanger module; a duct muffler; a duct connection; and a cable management cover, coupling at least one first lock to the housing wherein the at least one first lock engages to hold the first airflow management component, which covers the one of the plurality of apertures of the exhaust plenum; and coupling to the housing at least one second lock that engages to hold the second airflow management component, which covers the one of the plurality of apertures of the intake plenum.

19. The method of claim 18, further comprising:

preventing, with a stop, an airflow management component of the first airflow management component or the second airflow management component from being pushed off a slide rail extending along a length of the housing, wherein the airflow management component manages an airflow in the housing.

* * * * *